United States Patent
Sakoh et al.

(10) Patent No.: US 7,459,665 B2
(45) Date of Patent: *Dec. 2, 2008

(54) SOLID-STATE IMAGE SENSOR WITH TRANSPARENT FILM ON MICRO-LENSES BY WHICH OBLIQUE LIGHT IS REFRACTED TOWARDS LIGHT RECEIVING ELEMENTS

(75) Inventors: Hiroshi Sakoh, Kyotanabe (JP); Masato Kobayashi, Takatsuki (JP); Nobukazu Teranishi, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/812,613

(22) Filed: Jun. 20, 2007

(65) Prior Publication Data

US 2007/0246640 A1    Oct. 25, 2007

Related U.S. Application Data

(62) Division of application No. 10/909,311, filed on Aug. 3, 2004, now Pat. No. 7,253,399.

(30) Foreign Application Priority Data

Aug. 4, 2003    (JP)    ............................. 2003-285555

(51) Int. Cl.
  *H01L 27/00* (2006.01)
(52) U.S. Cl. .................................. 250/208.1; 250/216
(58) Field of Classification Search ................ 250/226, 250/208.1, 239, 216; 257/290–292, 440, 257/80–85
See application file for complete search history.

(56) References Cited

U.S. PATENT DOCUMENTS

| 5,239,412 | A | 8/1993 | Naka et al. |
|---|---|---|---|
| 5,479,049 | A | 12/1995 | Aoki et al. |
| 5,986,704 | A * | 11/1999 | Asai et al. .................... 348/340 |
| 6,518,640 | B2 | 2/2003 | Suzuki et al. |
| 6,861,280 | B2 | 3/2005 | Yamamoto |
| 6,995,800 | B2 | 2/2006 | Takahashi et al. |
| 2005/0253943 | A1 | 11/2005 | Takahashi et al. |

(Continued)

FOREIGN PATENT DOCUMENTS

JP    05-346556    12/1993

(Continued)

OTHER PUBLICATIONS

U.S. Appl. No. 11/599,353, Sakoh et al., filed Nov. 15, 2006.

*Primary Examiner*—Que T Le
(74) *Attorney, Agent, or Firm*—Wenderoth, Lind & Ponack, L.L.P.

(57) ABSTRACT

A solid-state image sensor includes a plurality of light-receiving elements arranged in a light-receiving area, and a plurality of micro-lenses corresponding to the light-receiving elements, and has a flattening film formed on the plurality of the micro-lenses. At a center of the light-receiving area, the micro-lenses are placed in positions directly above corresponding photodiodes, and placed in positions which are progressively offset from positions directly above the corresponding photodiodes, towards a center of the light receiving area, as micro-lenses are located farther from the center of the light-receiving area.

31 Claims, 16 Drawing Sheets

U.S. PATENT DOCUMENTS

2006/0044449 A1  3/2006  Sakoh

FOREIGN PATENT DOCUMENTS

| | | |
|---|---|---|
| JP | 6-232379 | 8/1994 |
| JP | 6-326284 | 11/1994 |
| JP | 09-148549 | 6/1997 |
| JP | 10-229180 | 8/1998 |
| JP | 11-111962 | 4/1999 |
| JP | 2001-160973 | 6/2001 |
| JP | 2001-358320 | 12/2001 |
| JP | 2002-170944 | 6/2002 |
| JP | 2003-209230 | 7/2003 |
| KR | 2003-0042305 | 5/2003 |

* cited by examiner

SOLID-STATE IMAGE SENSOR WITH TRANSPARENT FILM ON MICRO-LENSES BY WHICH OBLIQUE LIGHT IS REFRACTED TOWARDS LIGHT RECEIVING ELEMENTS

This application is a divisional of U.S. application Ser. No. 10/909,311, filed Aug. 3, 2004.

BACKGROUND OF THE INVENTION (1) Field of the Invention

The present invention relates to a solid-state image sensor including micro-lenses for a plurality of light-receiving elements formed on a semiconductor substrate, and a manufacturing method thereof.

(2) Description of the Related Art

In recent years, miniaturization of cameras is progressing along with increase in pixel count of solid-state image sensors.

With digital still cameras and camera-equipped mobile phones, a shortening of an exit pupil distance is progressing following the miniaturization of cameras. At this point, exit pupil refers to a virtual image of a lens (or stop) as seen from a light-receiving area, and exit pupil distance refers to a distance between the light-receiving area and a lens (refer to FIG. 18).

FIG. 18 illustrates a cross-section diagram of a camera portion of a mobile phone. A lens 110 is installed on a frame 111 of the mobile phone, and a CCD image sensor 112 is provided in an interior of the mobile phone. A distance between the lens 110 and the CCD image sensor 112 is an exit pupil distance D. Although incidence of light around a center of the light-receiving area is perpendicular, a periphery of the light-receiving area is limited to incidence of, not perpendicular, but oblique light.

FIG. 1 is a cross-section diagram illustrating a physical relationship of light-receiving elements and micro-lenses in an existing solid-state image sensor for facilitating shortening of an exit pupil distance. Light rays from a light source in the diagram represent incident light from a lens. The left side of the diagram represents a cross-section of a central portion of valid pixels making up a light-receiving area, and the right side represents a cross section of a peripheral portion of valid pixels making up the light-receiving area. As shown on the left side of the diagram, an in-layer lens 3, a color filter 5, and a micro-lens 7 are formed directly above a light-receiving element 1, in a central portion of the light-receiving area. Whereas in a peripheral portion of the light-receiving area, the in-layer lens 3, the color filter 5, and the micro-lens 7, are formed above the light-receiving element 1, offset towards a center of the light-receiving area, as shown in the right side of the diagram. In this manner, an existing solid-state image sensor forms a micro-lens in an offset position above a light-receiving element in a CCD image sensor light-receiving area, as a countermeasure for shortening of exit pupil distance. With this, an improvement of a light-collection rate for incident oblique light in the peripheral portion of the light-receiving area is promoted.

Furthermore, in a solid-state image sensor disclosed in official publication of Japanese Laid-Open Patent Application No. 06-326284, a transparent film with a lower refractive index than micro-lens material is provided, and deterioration of sensitivity upon lens stop release is minimized.

However, according to existing technology mentioned above, the shortening of exit pupil distance in response to slimming of mobile phone cameras and digital still cameras is reaching its threshold. For example, if the shortening of exit pupil distance should progress further with regard to the configuration in FIG. 1, the light-receiving elements will no longer be able to perform light-collection as intended, as shown in FIG. 2, and a problem of shading arises due to lack of sensitivity in the peripheral portion of the light-receiving area. In other words, from a center of an image, sensitivity deteriorates as a periphery of the image is neared, and a deterioration of image quality arises in which darkening worsens towards the periphery of the image.

In addition, due to the shortening of exit pupil distance, it is necessary to perform mask alignment with greater precision during a micro-lens formation process to form micro-lenses that are offset in appropriate positions for a case in FIG. 2 as well, and position alignment is becoming difficult in terms of design and production.

Furthermore, although deterioration of sensitivity upon lens stop release is reduced in the solid-state image sensor disclosed in official publication of Japanese Laid-Open Patent Application No. 06-326284, the same problem exists with regard to the shortening of exit pupil distance.

SUMMARY OF THE INVENTION

In view of the aforementioned issues, an object of the present invention is to provide a solid-state image sensor, a manufacturing method thereof, and a camera, that makes possible shortening of exit pupil distance, with low shading.

In order to resolve the aforementioned issues, the solid-state image sensor in the present invention is a solid-state image sensor including a plurality of light-receiving elements arranged in a light-receiving area, a plurality of micro-lenses corresponding to the light-receiving elements, and a flattening film formed on the plurality of micro-lenses, wherein the micro-lenses are placed in positions directly above corresponding light-receiving elements at a center of the light-receiving area, and placed in positions which are progressively offset from positions directly above corresponding light-receiving elements towards the center, as micro-lenses are located farther from the center.

Here, it is possible to have a structure wherein a refractive index of the flattening film is less than a refractive index of the micro-lenses.

According to this structure, shortening of exit pupil distance while having low shading can be made possible through a combination of incidence angle moderation by the flat film and an improvement of a light-collection rate through offsetting.

Here, it is possible to have a structure wherein the micro-lenses are arranged in a matrix, adjoining each other without gaps, in row and column directions.

According to this structure, it is possible to further improve a light-collection rate of the micro-lens.

Here, it is possible to have a structure where the solid-state image sensor further includes in-layer lenses formed between the micro-lenses and the light-receiving elements, wherein the in-layer lenses are placed in positions directly above the corresponding light-receiving elements at the center of the light-receiving area, and placed in positions which are progressively offset from the positions directly above the corresponding light-receiving elements towards the center, as in-layer lenses are located farther from the center, and the offset of each micro-lens is greater than the offset of corresponding in-layer lens.

According to this structure, shortening of exit pupil distance while having low shading can be made possible even in a structure having two or more layers of micro-lenses or two or more layers of in-layer lenses.

Here, it is possible to have a structure wherein at least one of a curvature and a thickness of the micro-lenses is greater than a curvature and thickness of the in-layer lenses.

According to this structure, it is possible to further improve the light-collection rate of the micro-lens.

Here, it is possible to have a structure wherein the micro-lenses also serve as color filters.

According to this structure, elimination of the color filter layer allows for just as much thinning of the solid-state image sensor.

Furthermore, the manufacturing method for the solid-state image sensor in the present invention has the same structuring effect as that mentioned above, for a camera provided with a solid-state image sensor.

According to the solid-state image sensor in the present invention, shortening of exit pupil distance while having low shading can be made possible through the combination of the incidence angle moderation by the flat film and the improvement of light-collection rate in the peripheral portion of the light-receiving area through micro-lens offsetting.

FURTHER INFORMATION ABOUT TECHNICAL BACKGROUND TO THIS APPLICATION

The disclosure of Japanese Patent Application No. 2003-285555 filed on Aug. 4, 2003, including specification, drawings and claims, is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate specific embodiments of the invention.

In the Drawings.

DETAILED DESCRIPTION OF THE PREFERRED EMBODIMENTS

First Embodiment (Structure of a Solid-State Image Sensor)

Figure 1:
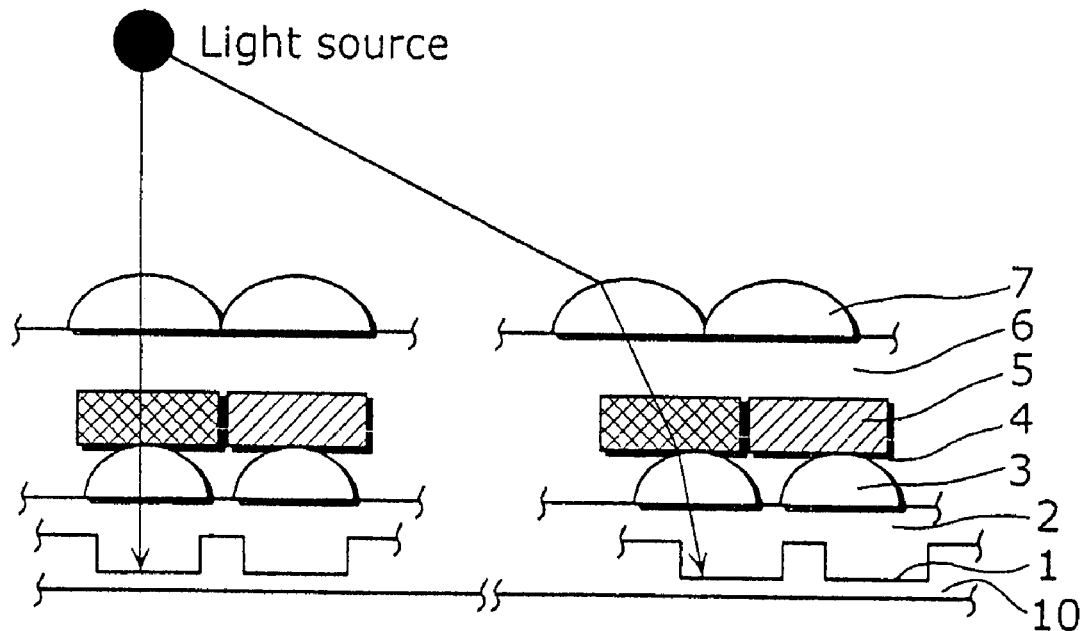
FIG. 1 is a cross-section diagram of an existing solid-state image sensor.
Figure 2:
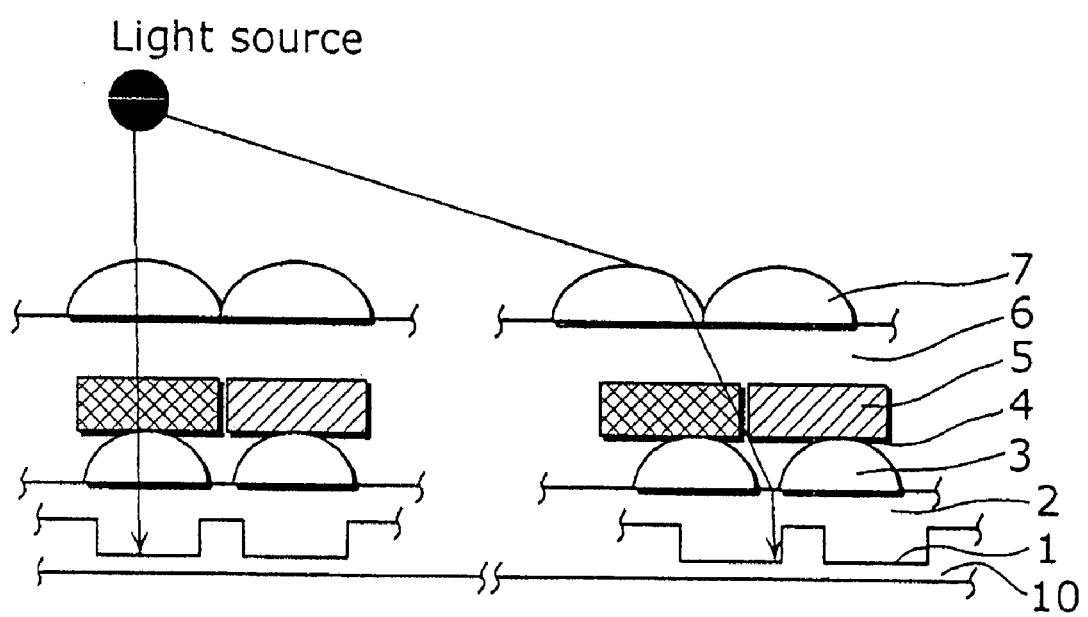
FIG. 2 is a cross-section diagram of an existing solid-state image sensor.
Figure 3:
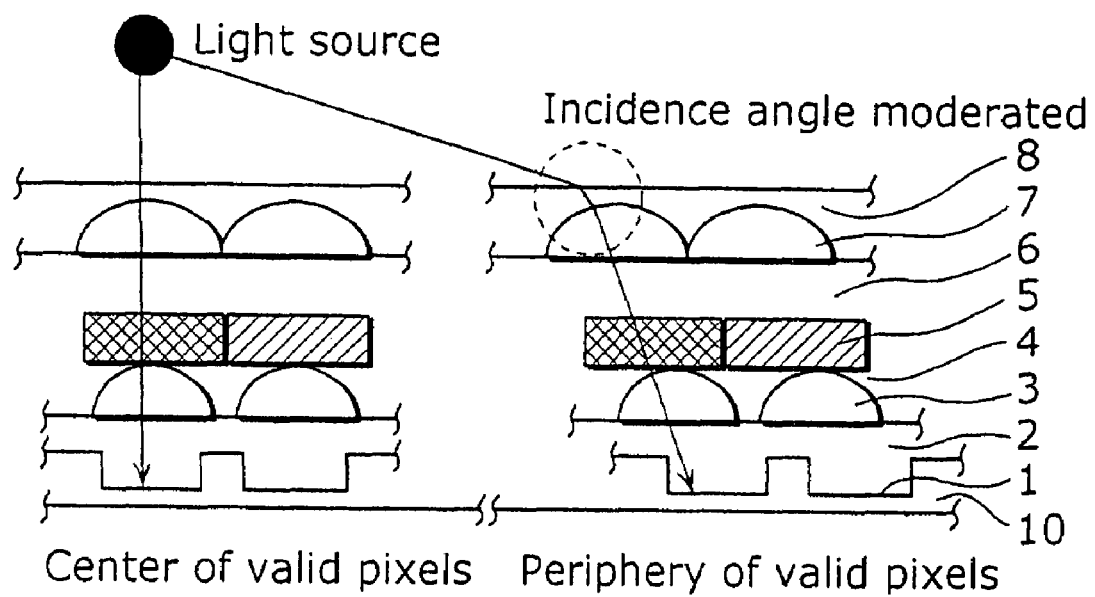
FIG. 3 is a cross-section diagram of a solid-state image sensor in a first embodiment of the present invention.
Figure 18:
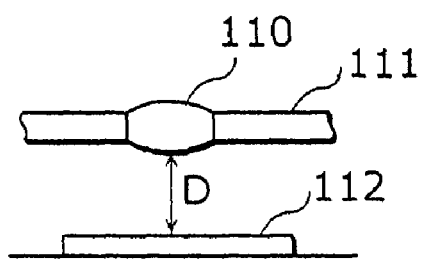
FIG. 18 is a diagram illustrating a physical relationship of a camera lens and a CCD image sensor.

FIG. 3 is a diagram representing a cross-section of a solid-state image sensor in a first embodiment of the present invention. This solid-state image sensor includes a light-receiving area in which light-receiving elements (photodiodes) are arranged two-dimensionally. The diagram represents a cross-section of two light-receiving elements in a central portion (diagram, left) and a cross-section of two light-receiving elements in a peripheral portion (diagram, right) of the light-receiving area. Furthermore, solid lines in the diagram schematically represent incident light from a light source (equivalent to the lens 110 shown in FIG. 18).

The solid-state image sensor in the same diagram is formed by stacking, a flattened transparent insulating film (protective film) 2 which is made out of material such as boron phosphate silicate glass (BPSG), an in-layer lens 3 having a high refractive index (n=1.5 to 2.0) and convex shape, an in-layer lens flat film 4 made out of an acrylic transparent resin, a color filter 5 made out of a color resist containing a dye or pigment, a transparent film 6 made out of an acrylic transparent resin, a micro-lens (also known as a top lens) 7, and a flattening film 8, in the order of mention, above a photodiode 1 formed on a silicon semiconductor substrate 10. This enables shortening of an exit pupil distance (1) by having the flattening film 8 above the micro-lens 7, and (2) arranging the in-layer lens 3, color filter 5, and micro-lens 7, in positions that are offset towards a center, with this offset increasing with proximity to a periphery of the light-receiving area. Moreover, a size of individual cells including a single photodiode is, for example, about 3 μm in length and width, or less, and a distance from the photodiode 1 to a bottom of the micro-lens 7 is in the area of about 3 to 5 μm.

To explain more specifically regarding (1), the flattening film 8 makes use of a material having a lower refractive index than material of the micro-lens 7 (n=1.6 to 1.7). For example, the material of the flattening film 8 is an acrylic resin with a refractive index of n=1.4 to 1.5. As such, although only incident light with a large incidence angle (assuming 0 degrees at a perpendicular direction to the light-receiving area) incidents in a periphery of valid pixels within the light-receiving area, the incidence angle towards the micro-lens 7 can be moderated (reduced) by passing the incident light having a large incidence angle, through the flattening film 8, as shown on the right side of the diagram. Furthermore, the in-layer lens flat film 4 makes use of a material having a lower refractive index than material of the in-layer lens 3. For example, the material of the in-layer lens flat film 4 is an acrylic resin with a refractive index of n=1.4 to 1.5.

To explain more specifically regarding (2), in a center of the valid pixels within the light-receiving area, the in-layer lens 3, the color filter 5, and the micro-lens 7, are formed in positions stacked directly above the photodiode 1, as shown on the left side of the diagram. In contrast, in the periphery of the valid pixels within the light-receiving area, the in-layer lens 3, the color filter 5, and the micro-lens 7 are formed offset towards the center, as shown on the right side of the diagram. This amount of offset, with regard to the individual in-layer lens 3, color filter 5, and micro-lens 7, is largest at the periphery, becomes smaller as the center is neared, and is "0" at the center. Furthermore, the offset increases with a higher layer, from the in-layer lens 3, the color filter 5, and micro-lens 7, in that order. With this offsetting, light-collection in the photodiode 1 can be performed efficiently for incident light with a large incidence angle in the periphery.

In addition, as another mechanism for improving a rate of light-collection in the solid-state image sensor in the diagram, aside from (1) and (2), (3) two-dimensionally arranged micro-lenses 7 are formed adjacent each other in columns and rows in such a way that no gaps are left therebetween. In addition, (4) each micro-lens 7 is formed with a greater curvature and thickness than the in-layer lens 3. In this manner, an improvement of the light-collection rate is promoted through an increase, as much as possible, of the diameter, and an increase of the curvature and thickness of the micro-lens 7, combined with the aforementioned (1) and (2).

As explained so far, according to the solid-state image sensor in the present embodiment, it is possible to improve sensitivity in the peripheral portion of the light-receiving area even for oblique light having larger incidence angles, by combining incidence angle moderation through the flattening film 8 and the above-mentioned light-collection rate improvement. As a result, shortening of an exit pupil distance is made possible while suppressing shading.

(Manufacturing Method of the Solid-State Image Sensor)

Figure 4:
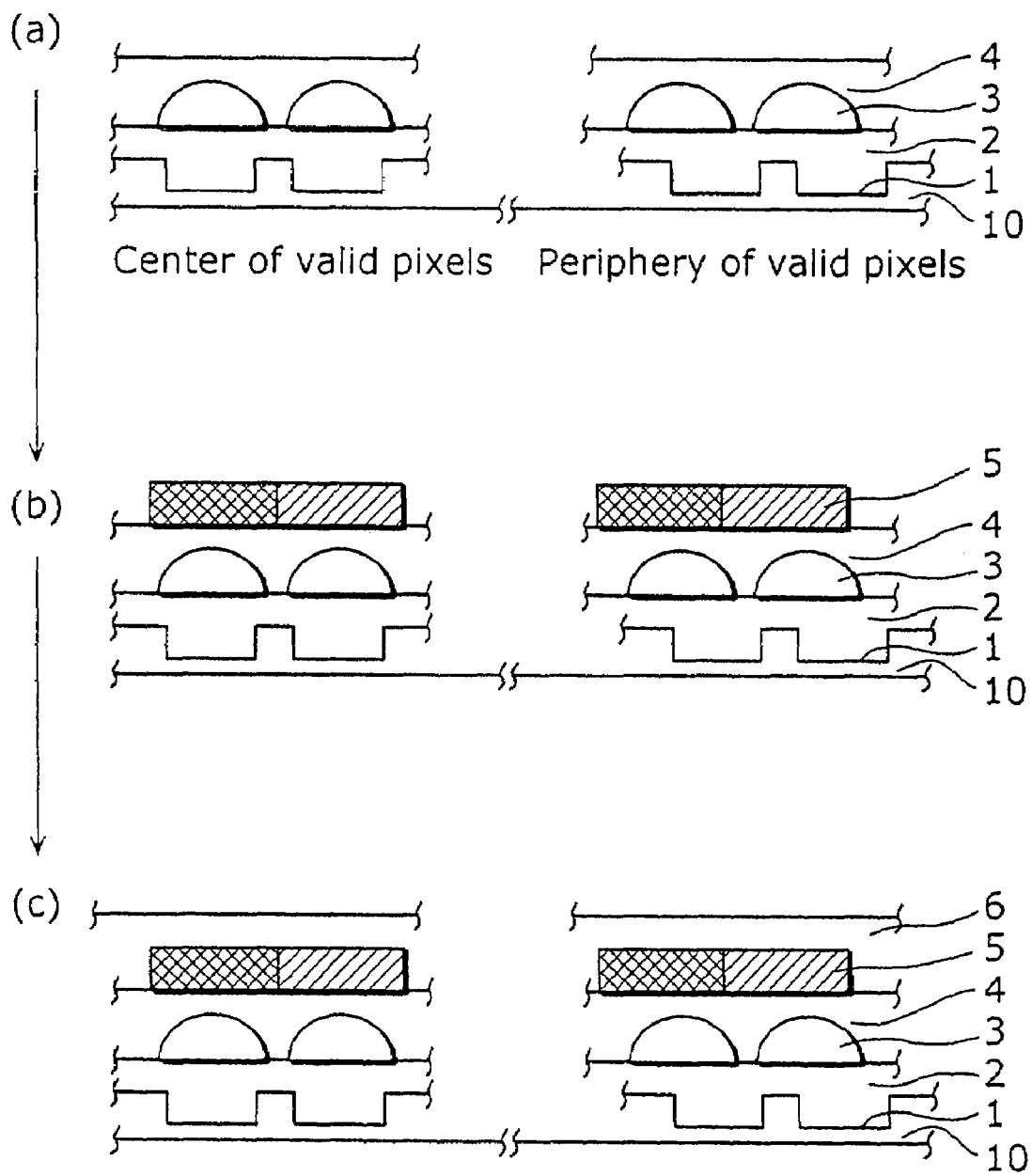
FIG. 4 is a diagram illustrating a manufacturing process for the solid-state image sensor of the first embodiment.
Figure 5:
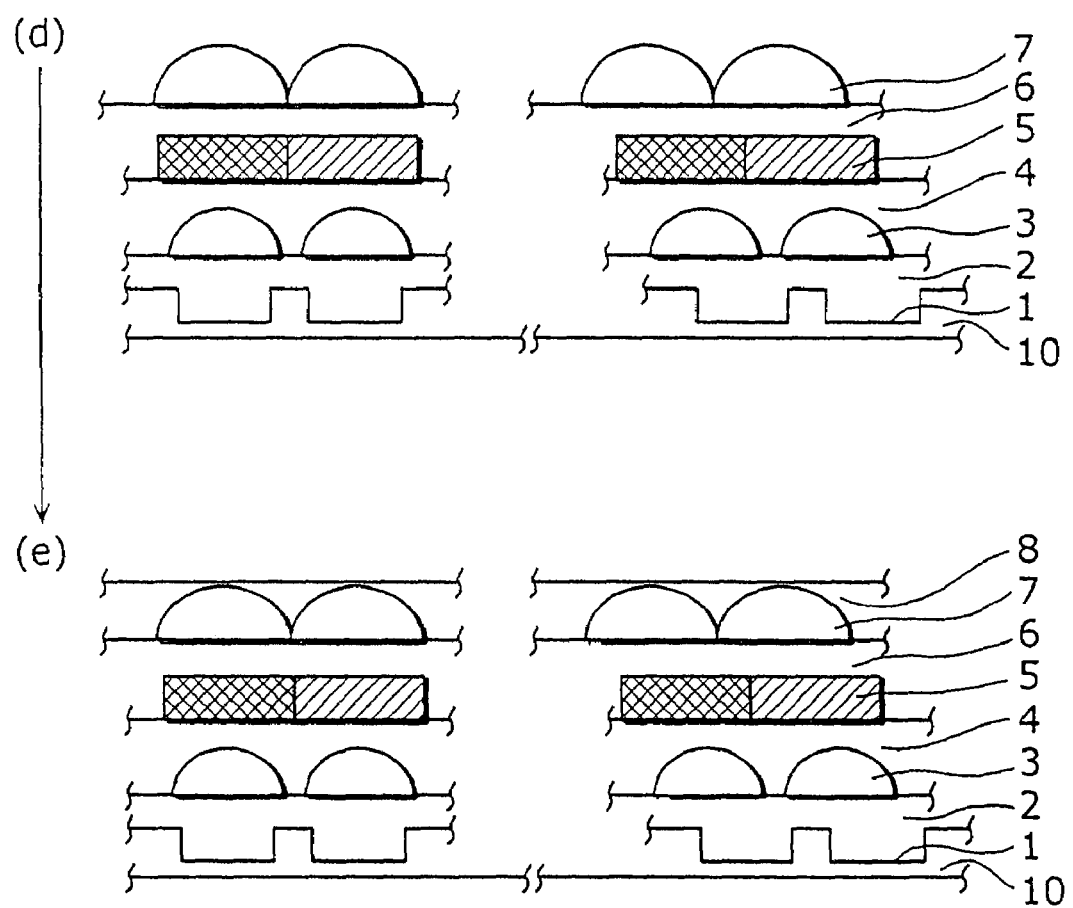
FIG. 5 is a diagram illustrating a continuation of the manufacturing process for the solid-state image sensor of the first embodiment.

FIG. 4, (a) to (c), and FIG. 5, (d) to (e), are diagrams illustrating cross-sections of the solid-state image sensor in the first embodiment, in a manufacturing sequence. These manufacturing processes are explained in (11) to (15) below.

(11) As shown in FIG. 4(a), an in-layer lens 3 is formed, and an in-layer lens flat film 4 is formed on the in-layer lens 3. At this point, the in-layer lens 3 is formed by using a mask (first mask) in which forming positions of the in-layer lens 3 are offset towards a center, with this offset increasing with proximity to a periphery of a light-receiving area. The in-layer lens flat film 4 is formed by application of an acrylic resin, for example.

(12) As shown in FIG. 4(b), a color filter 5 is formed on top of the in-layer lens flat film 4. For example, in a case of the Bayer Array, which is typical of a primary color filter using the three colors, red, green, and blue (RGB), color resist application, exposure, and development is repeated for each of the colors R, G, and B. During this exposure, a mask (second mask) is used in which forming positions of the color filter 5 are offset towards the center, with this offset increasing with proximity to the periphery of the light-receiving area. Here, the offset of the second mask is larger than that of the first mask.

Accordingly, color filters corresponding to each photodiode 1 are formed.

Moreover, it is the same in a case where a complementary color filter, not a primary color filter, is formed. For example, in a complementary color checkered array that is typical as a complementary color filter, color resist application, exposure, and development can just be repeated for four colors, namely, green (G), and each of complementary colors yellow (Ye), magenta (Mg), and cyan (Cy).

(13) As shown in FIG. 4(c), a transparent film 6 is formed on the color filter 5. This is done through application of an acrylic resin, for example.

(14) As shown in FIG. 5(d), a micro-lens 7 is formed on the transparent film 6. To be specific, after forming a lens layer only on micro-lens placement positions by applying, exposing and developing, 1 to 2 μm of a phenolic resin (refractive index n=1.5 to 1.7) as a resist, a curved surface of the lens is formed by thermal flow processing. During this exposure, a mask (third mask) is used in which forming positions of the micro-lens 7 are offset towards the center, with this offset increasing with proximity to the periphery of the light-receiving area. Here, the third mask has a larger offset than the second mask.

(15) As shown in FIG. 5(e), a flattening film 8 is formed on the micro-lens 7. To be specific, the flattening film 8 is formed by applying a 1 to 2 μm transparent film of acrylic resin (refractive index n=1.4 to 1.5).

The solid-state image sensor shown in FIG. 3 can be manufactured through the aforementioned manufacturing process.

(Variation of the Manufacturing Method)

Figure 6:
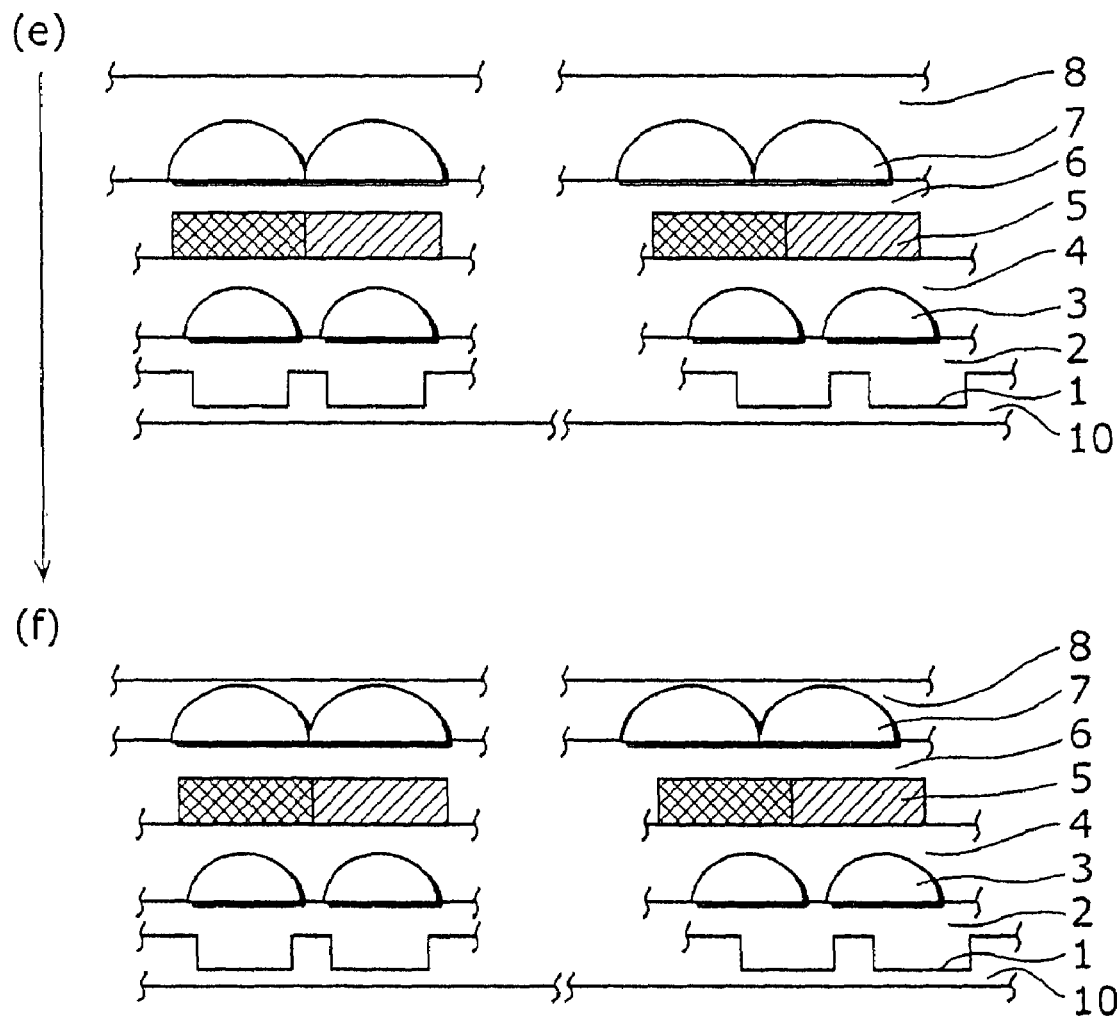
FIG. 6 is a diagram illustrating a variation of the manufacturing process for the solid-state image sensor of the first embodiment.

Moreover, processes in (15a) and (16) can be performed in place of aforementioned process (15), in the manufacturing method shown in FIG. 4 and FIG. 5. FIG. 6, (e) to (f), is a diagram illustrating cross-sections for the processes in (15a) and (16), in this variation. Hereinafter, (15a) and (16) shall be explained.

(15a) As shown in FIG. 6(e), a flattening film 8 is formed on a micro-lens 7. To be specific, a 0.5 to 2 μm transparent film of acrylic resin (refractive index n=1.4 to 1.5) is applied.

(16) As shown in FIG. 6(f), film thickness is adjusted by etching this applied transparent film. Moreover, (15a) and (16) can be repeated. With this, the film thickness of the flattening film 8 can be precisely adjusted.

In this manner, the solid-state image sensor shown in FIG. 3 can be manufactured, and the film thickness of the flattening film 8 can be accurately optimized, even through the present variation.

Second Embodiment (Structure of a Solid-State Image Sensor)

Figure 7:
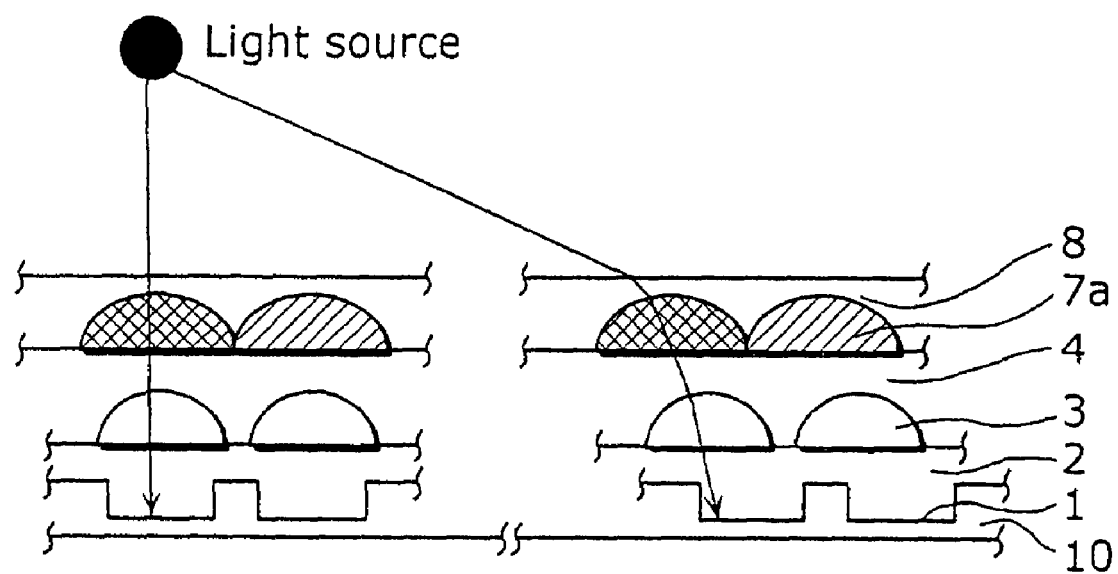
FIG. 7 is a cross-section diagram of a solid-state image sensor in a second embodiment of the present invention.

FIG. 7 is a cross-section diagram of a solid-state image sensor in a second embodiment of the present invention. This structure in the same diagram is different in comparison to the structure in FIG. 3, in having the color filter 5 omitted, and having a micro-lens 7a in place of the micro-lens 7. Hereinafter, explanation shall be made centering on these points of difference, with explanation on points of similarity being omitted.

The micro-lens 7a is different from the micro-lens 7 in that, being non-transparent, it also serves as a color filter.

According to this structure, as the micro-lens 7a also serves as a color filter, reduction of one color filter layer's worth of thickness furthers thinning of the solid-state image sensor, in addition to enabling shortening of an exit pupil distance while also being able to limit shading as in the first embodiment. For example, in a case where a distance from the photodiode 1 to the bottom of the micro-lens 7 of the solid-state image sensor in the first embodiment is 3.0 to 5.5 μm, the solid-state image sensor in the second embodiment can be a slimmed down to a 2.0 to 4.5 μm thin-film. As a result, color mixing of light passing through color filters of adjacent photodiodes can be reduced, and image quality can be improved.

(Manufacturing Method of the Solid-State Image Sensor)

Figure 8:
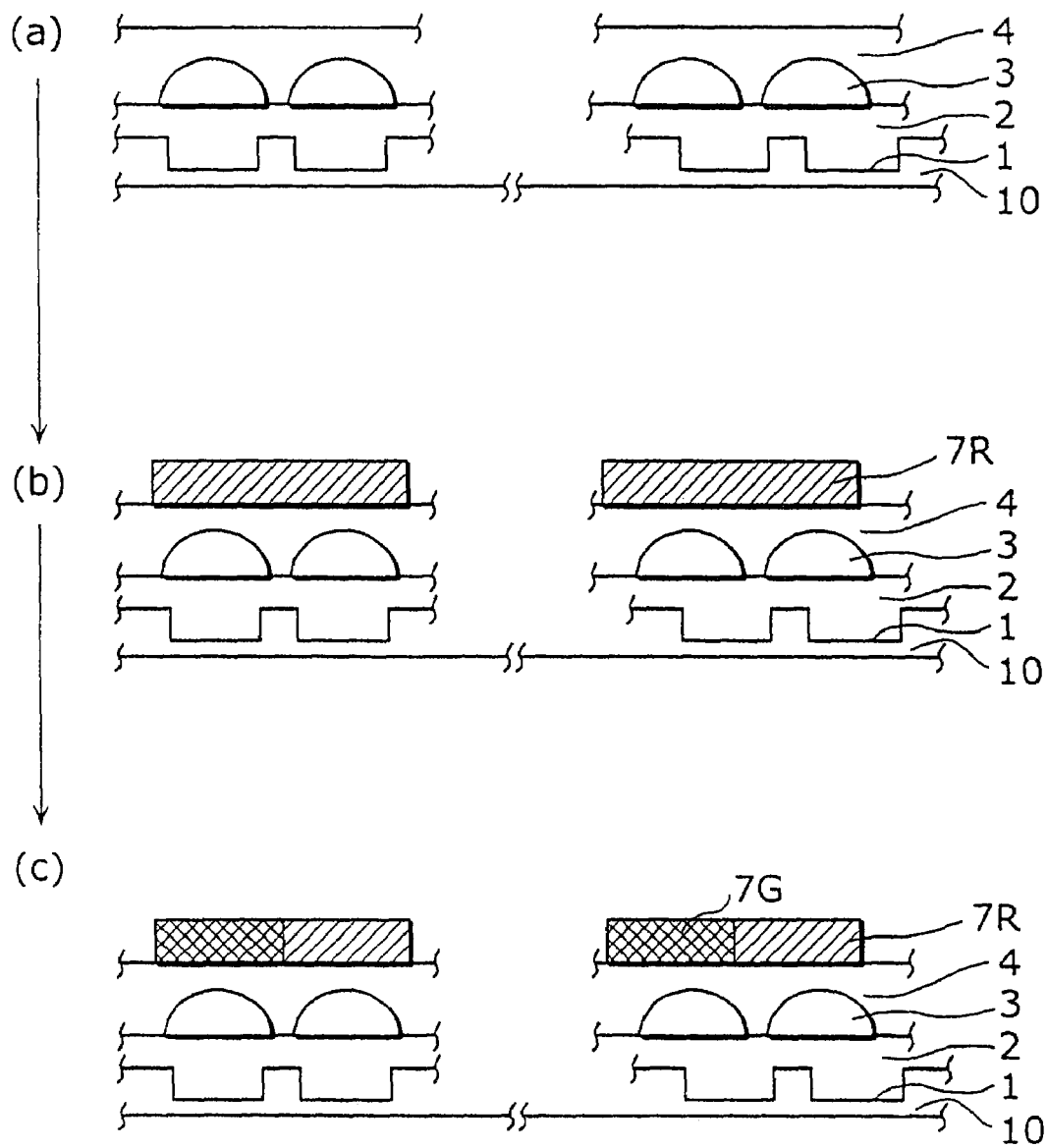
FIG. 8 is a diagram illustrating a manufacturing process for the solid-state image sensor of the second embodiment.
Figure 9:
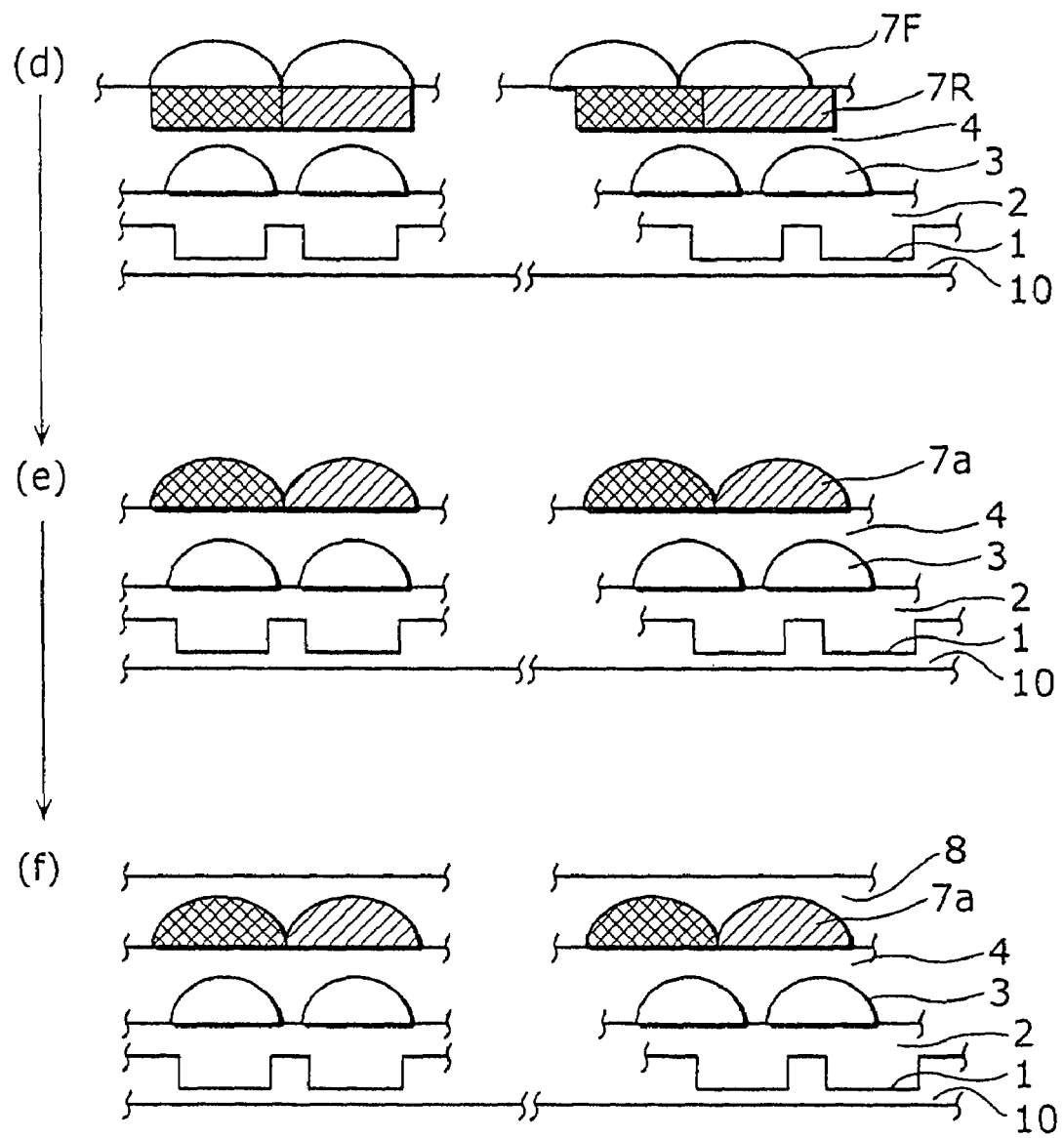
FIG. 9 is a diagram illustrating a continuation of the manufacturing process for the solid-state image sensor of the second embodiment.

FIG. 8, (a) to (c), and FIG. 9, (d) to (f), are diagrams illustrating a manufacturing process of the solid-state image sensor of the second embodiment. Such manufacturing process shall be explained in (21) to (26) below.

(21) As shown in FIG. 8(a), an in-layer lens 3 is formed, on which an in-layer lens flat film 4 is formed. As this process is the same as that in (11) mentioned previously, detailed explanation shall be omitted.

(22) As shown in FIG. 8(b), a color resist 7R is applied (0.5 to 2.0 μm) on the in-layer lens flat film 4. FIG. 8(b) shows a case where R (red) color resist is applied.

(23) The color resist 7R is only formed above photodiodes corresponding to R (red) by exposing and developing this applied color resist 7R. During this exposure, a mask (second mask) is used in which forming positions of the color resist are offset towards a center, with this offset increasing with proximity to a periphery of the light-receiving area.

(24) As shown in FIG. 8(c), even with regard to G (green) and B (blue), a color resist is formed above photodiodes corresponding to each color by performing application, exposure, and development of the color resist in the same manner. Although only two pixels for R and G are represented in FIG. 8(c), the color resist for each of the colors RGB is formed.

(25) As shown in FIG. 9(d), a shape of a micro-lens is formed on top of a color resist through application, exposure, development, and thermal flow processing of a resist that can be subjected to thermal flow processing (e.g., a phenolic resin).

(26) As shown in FIG. 9(e), this lens shape can be transferred to the color resist by etching back. With this, a micro-lens 7a is formed.

(27) As shown in FIG. 9(f), a flattening film 8 is formed on a micro-lens 7a. As this process is the same as that in (15) mentioned previously, detailed explanation shall be omitted.

The solid-state image sensor shown in FIG. 7 can be manufactured through the aforementioned manufacturing process. Moreover, although a case of primary color filters is explained in the aforementioned process (23) and (24), a complementary color filter can also be formed in the same manner as previously explained in (12).

(Variation)

Figure 10:
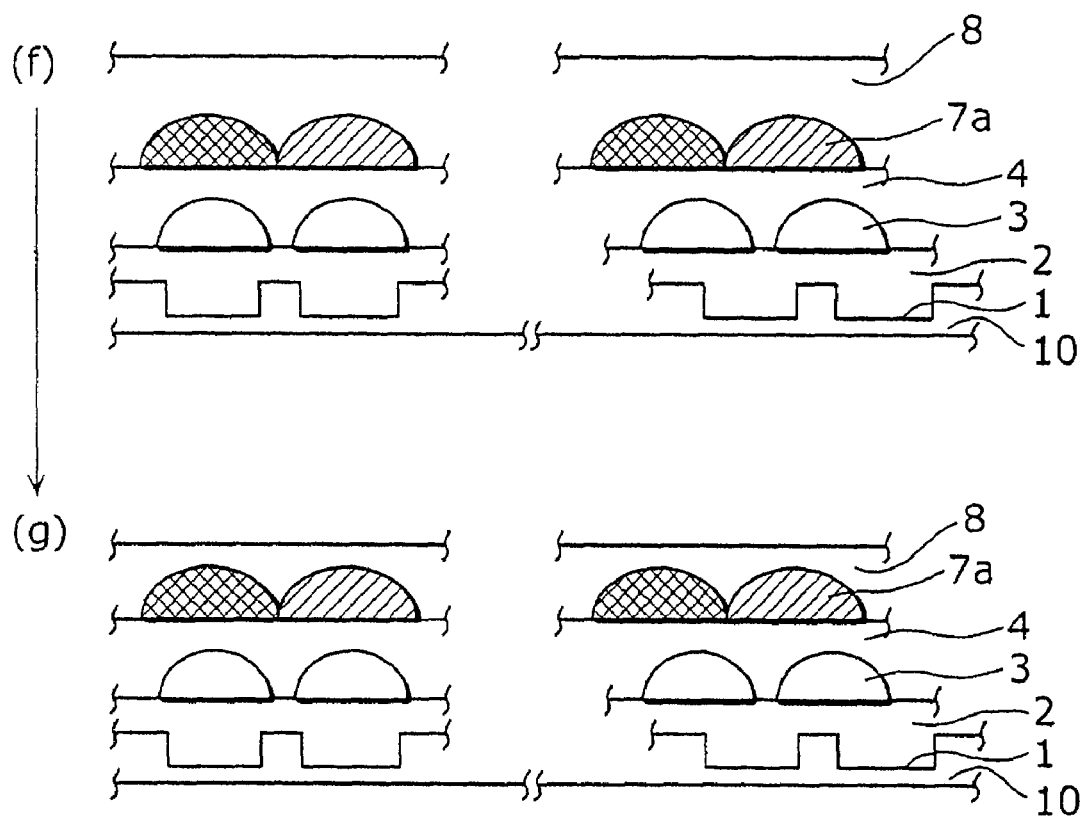
FIG. 10 is a diagram illustrating a variation of the manufacturing process for the solid-state image sensor of the second embodiment.

Moreover, processes in (27a) and (28) can also be performed in place of the aforementioned process (27) in the manufacturing method shown in FIG. 8, (a) to (c), and FIG. 9, (d) to (f). FIG. 10, (f) to (g), is a diagram illustrating cross-sections of processes in (27a) and (28) in this variation. Hereinafter, explanation shall be made regarding (27a) and (28).

(27a) As shown in FIG. 10(f), a flattening film 8 is formed on a micro-lens 7a. To be specific, a 0.5 to 2 μm transparent film of acrylic resin (refractive index n=1.4 to 1.5) is applied.

(28) As shown in FIG. 10(g), film thickness is adjusted by etching this applied transparent film. Moreover, (27a) and (28) can be repeated. With this, the film thickness of the flattening film 8 can be precisely adjusted.

In this manner, the solid-state image sensor shown in FIG. 7 can be manufactured, and the film thickness of the flattening film 8 can be accurately optimized, even through the present variation.

Third Embodiment (Structure of a Solid-State Image Sensor)

Figure 11:
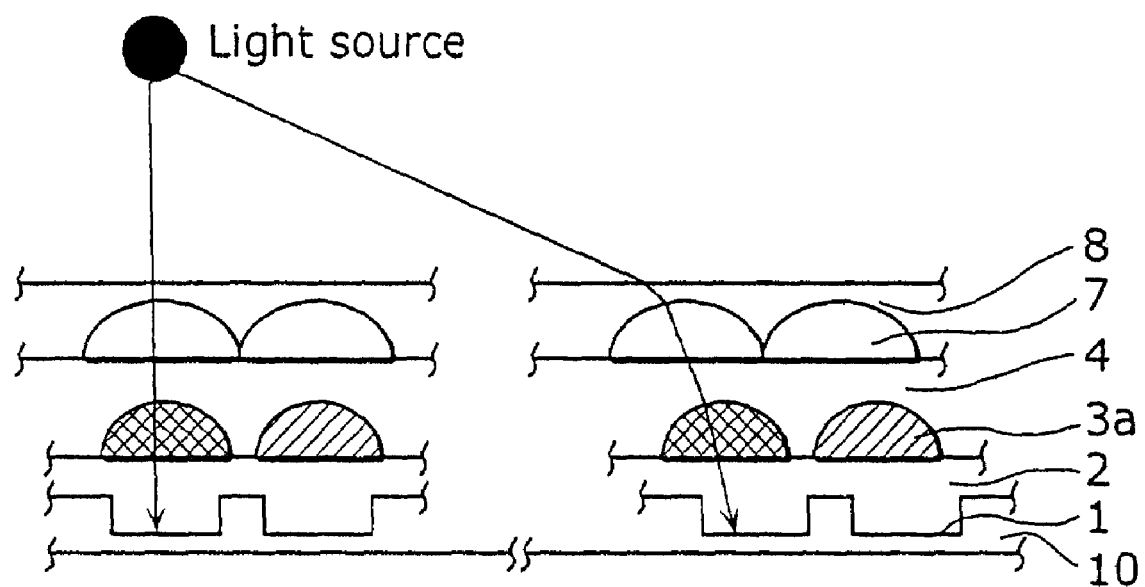
FIG. 11 is a cross-section diagram of a solid-state image sensor in a third embodiment of the present invention.

FIG. 11 is a cross-section diagram of a solid-state image sensor in a third embodiment of the present invention. This structure in the same diagram is different in comparison to the structure in FIG. 3 in having the color filter 5 omitted, and having an in-layer lens 3a in place of the in-layer lens 3. Hereinafter, explanation shall be made centering on these points of difference, with explanation on points of similarity being omitted.

The in-layer lens 3a is different from the in-layer lens 3 in that, being non-transparent, it also serves as a color filter.

According to this structure, as the in-layer lens 3a also serves as a color filter, reduction of one color filter layer's worth of thickness furthers thinning of the solid-state image sensor, in addition to enabling the shortening of an exit pupil distance while also being able to limit shading as in the first embodiment. For example, in a case where a distance from the photodiode 1 to the bottom of the micro-lens 7 of the solid-state image sensor in the first embodiment is 3.0 to 5.5 μm, the solid-state image sensor in the third embodiment can be slimmed down to a 2.0 to 4.5 μm thin-film. As a result, color mixing of light passing through color filters of adjacent photodiodes can be reduced, and image quality can be improved. In addition, as a distance of the in-layer lens 3, which is a color filter, and the photodiode 1 is short in the solid-state image sensor in the third embodiment compared to the solid-state image sensor in the second embodiment, color mixing can be further reduced.

(Manufacturing Method of the Solid-State Image Sensor)

Figure 12:
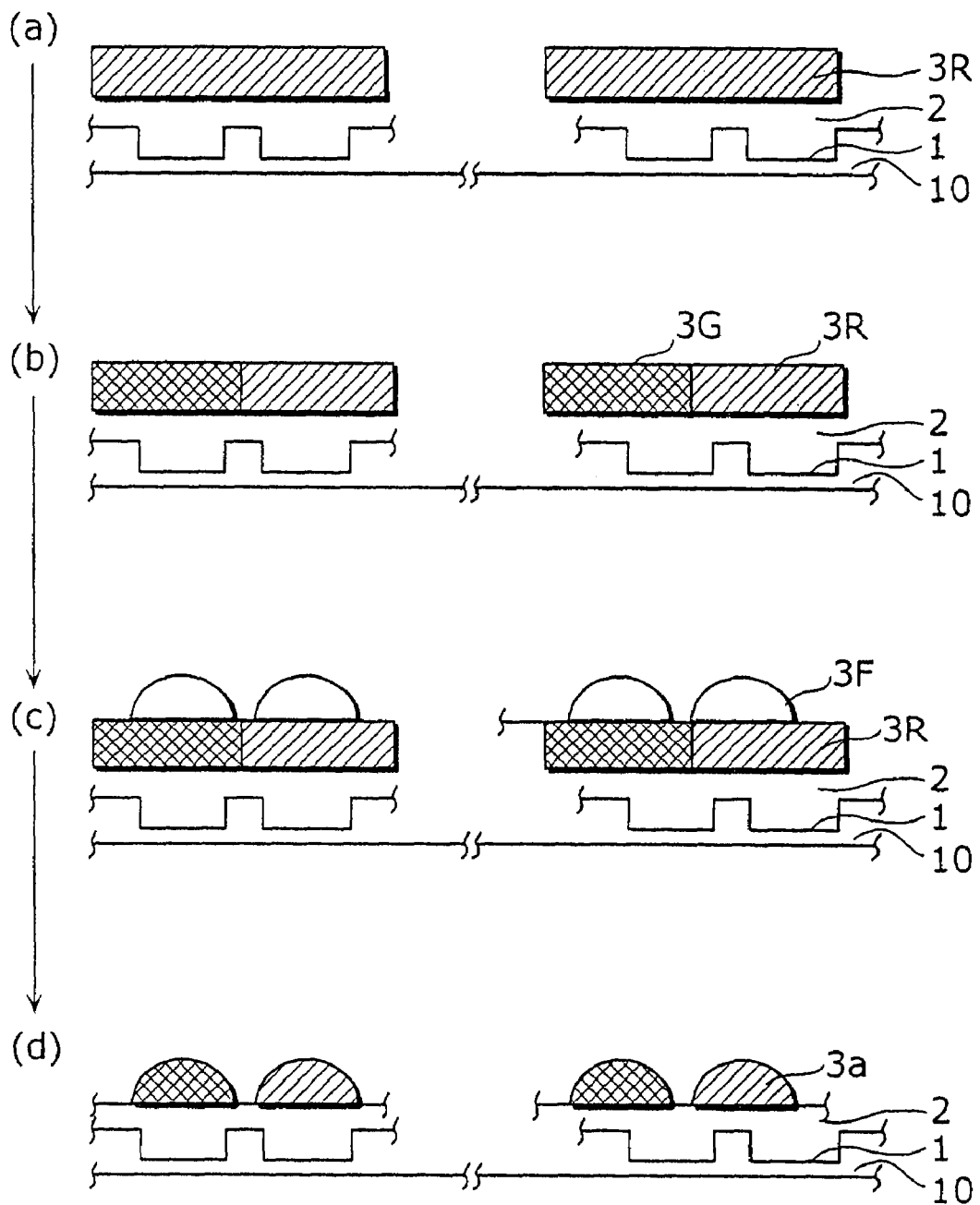
FIG. 12 is a diagram illustrating a manufacturing process for the solid-state image sensor of the third embodiment.
Figure 13:
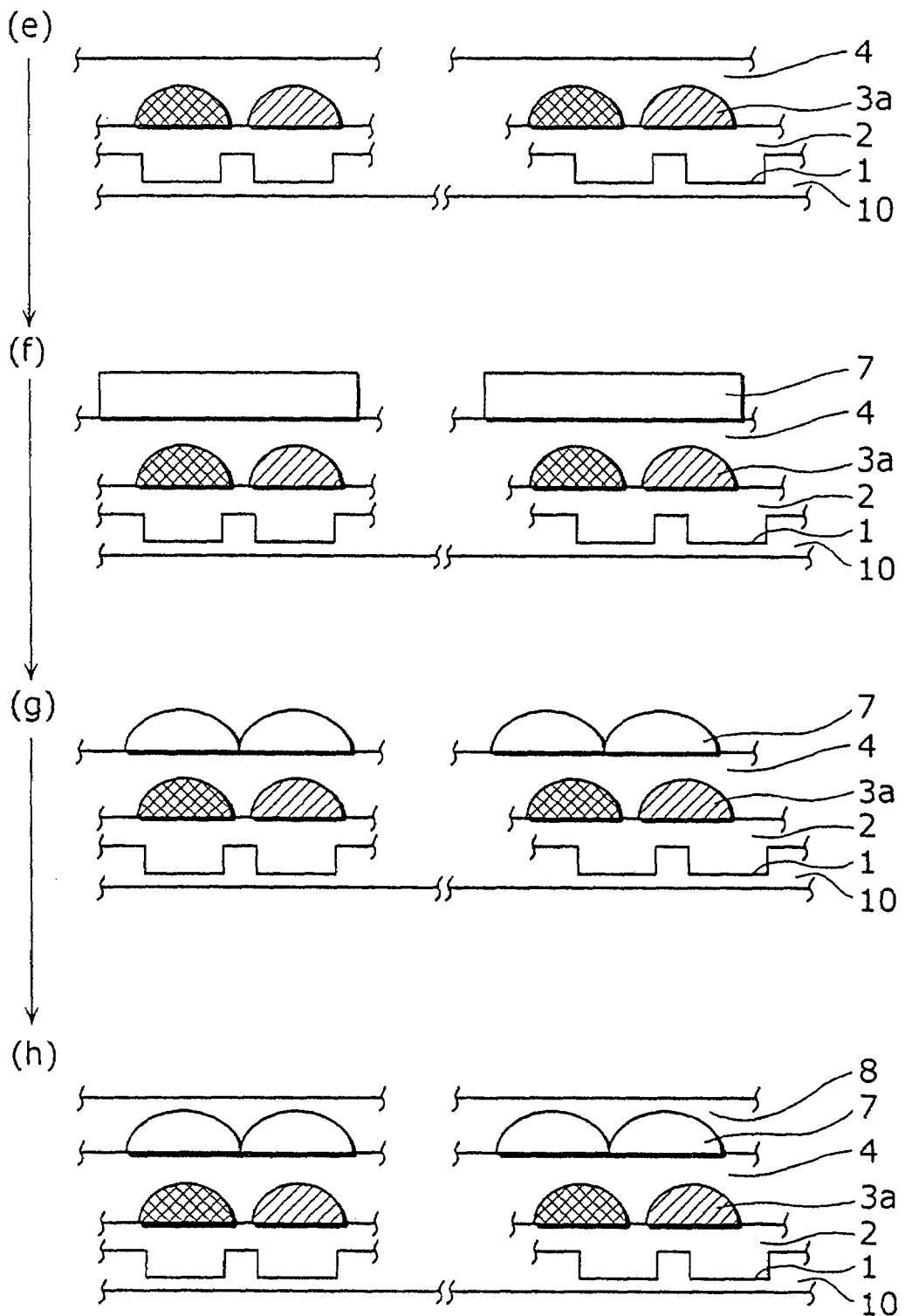
FIG. 13 is a diagram illustrating a continuation of the manufacturing process for the solid-state image sensor of the third embodiment.

FIG. 12, (a) to (d), and FIG. 13, (a) to (h), are diagrams illustrating cross-sections of the solid-state image sensor of the third embodiment, in manufacturing sequence. These manufacturing processes are explained in (31) to (39) below.

(31) As shown in FIG. 12(a), a color resist 3R is applied (0.5 to 2 μm) on insulating film 2. A case where R (red) color resist is applied is shown.

(32) The color resist 3R is only formed above photodiodes corresponding to R (red) by exposing and developing this applied color resist 3R. During this exposure, a mask (first mask) is used in which forming positions of the color resist are offset towards a center, with this offset increasing with proximity to a periphery of a light-receiving area.

(33) As shown in FIG. 12(b), even with regard to G (green) and B (blue), a color resist is formed above photodiodes corresponding to each color by performing application, exposure, and development of color resist 3G and 3B in the same manner. Although only two pixels for R and G are represented in FIG. 12(b), a color resist for each of the colors RGB is formed.

(34) As shown in FIG. 12(c), an in-layer lens shape is formed on top of a color resist through application, exposure, development, and thermal flow processing of a resist that can be subjected to thermal flow processing (e.g., a phenolic resin). A mask having the same offset as the aforementioned first mask is also used during this exposure.

(35) As shown in FIG. 12(d), an in-layer lens shape can be transferred to the color resist by etching. With this, an in-layer lens 3a is formed.

(36) As shown in FIG. 13(e), an in-layer lens flat film 4 is formed on the in-layer lens 3a.

(37) As shown in FIG. 13(f), micro-lens material is applied onto the in-layer lens flat film 4.

(38) As shown in FIG. 13(g) a micro-lens 7 is formed by exposure, development, and thermal flow processing of this applied micro-lens material. As the process in (38) is the same as that in (14) mentioned previously, detailed explanation shall be omitted.

(39) As shown in FIG. 13(h), a flattening film 8 is applied onto the micro-lens. As this process is the same as that in (15), detailed explanation shall be omitted.

The solid-state image sensor shown in FIG. 11 can be manufactured through the manufacturing process mentioned above. Moreover, although a case of primary color filters is explained in the aforementioned processes in (31) to (33), a complementary color filter can also be formed in the same manner as previously explained in (12).

(Variation)

Figure 14:
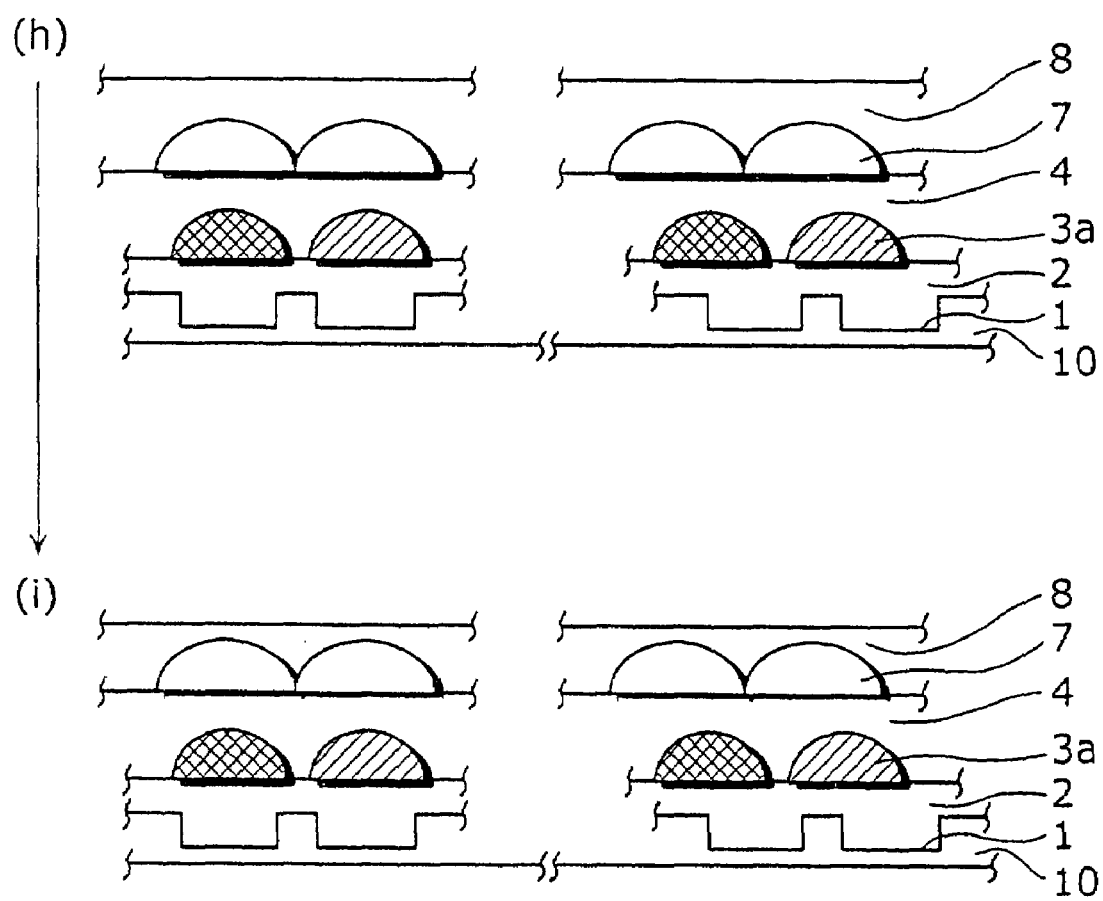
FIG. 14 is a diagram illustrating a variation of the manufacturing process for the solid-state image sensor of the third embodiment.

Moreover, processes in (39a) and (40) can also be performed in place of the process in (39) mentioned previously, in the manufacturing method shown in FIG. 12, (a) to (d), and FIG. 13, (e) to (h). FIG. 14, (h) to (i), is a diagram illustrating cross-sections for the processes in (39a) and (40) in this variation. Hereinafter, explanation shall be made regarding (39a) and (40).

(39a) As shown in FIG. 14(h), a flattening film 8 is formed on a micro-lens 7. To be specific, a 0.5 to 2 μm transparent film of acrylic resin (refractive index n=1.4 to 1.5) is applied.

(40) As shown in FIG. 14(i), film thickness is adjusted by etching this applied transparent film. Moreover, (39a) and (40) can be repeated. With this, the film thickness of the flattening film 8 can be precisely adjusted.

In this manner, the solid-state image sensor shown in FIG. 11 can be manufactured, and the film thickness of the flattening film 8 can be accurately optimized, even through the present variation.

Fourth Embodiment (Structure of a Solid-State Image Sensor)

Figure 15:
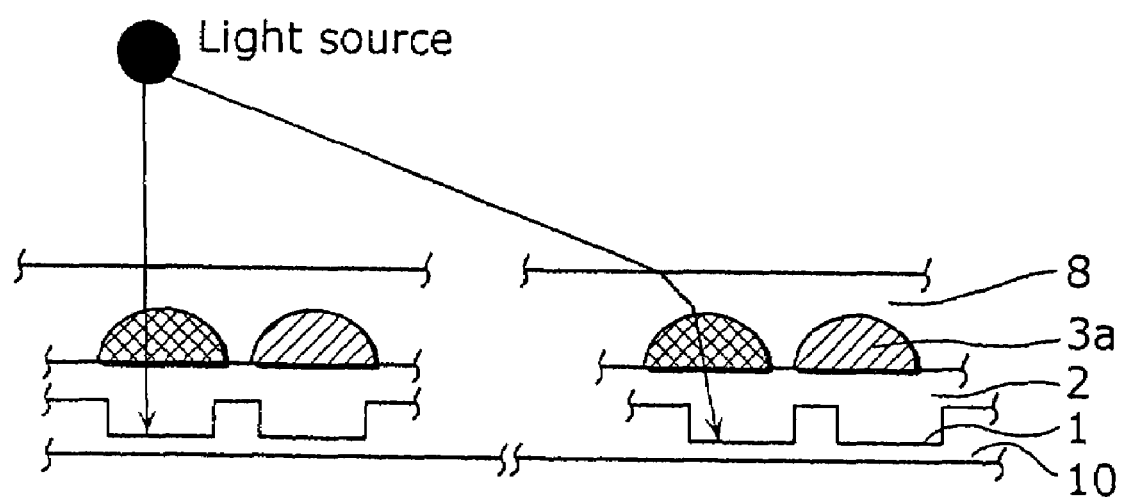
FIG. 15 is a cross-section diagram of a solid-state image sensor in a fourth embodiment of the present invention.

FIG. 15 is a cross-section diagram of a solid-state image sensor in a fourth embodiment of the present invention. In comparison to the structure in FIG. 11, structure in the same diagram is different in having the in-layer lens flat film 4, the color filter 5, and the micro-lens 7 omitted, and having a flattening film 8 above an in-layer lens 3. Furthermore, as the flattening film 8 can be of the same material as the in-layer lens flat film 4, it can also be said that compared with the structure in FIG. 11, the solid-state image sensor of the fourth embodiment assumes a structure in which the micro-lens 7 and the flattening film 8 are omitted.

According to this structure, in addition to enabling shortening of an exit pupil distance while also being able to limit shading as in the first embodiment, further thinning of the solid-state image sensor can be realized due to a difference in having a single layer of the in-layer lens 3a instead of two layers of the micro-lens 7 and the in-layer lens 3.

(Manufacturing Method of the Solid-State Image Sensor)

Figure 16:
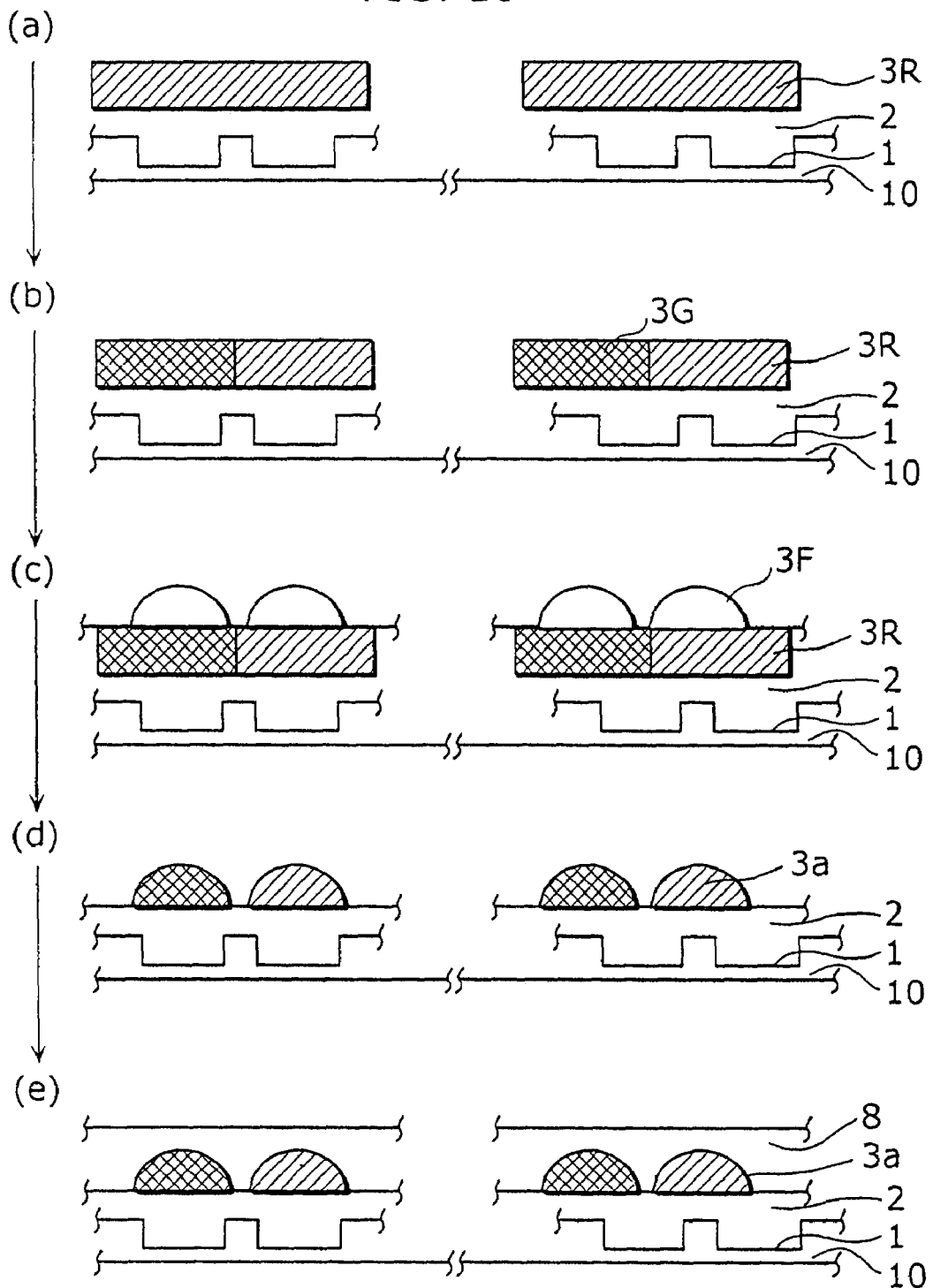
FIG. 16 is a diagram illustrating a manufacturing process for the solid-state image sensor of the fourth embodiment.

FIG. 16, (a) to (e), is a diagram illustrating cross-sections of the solid-state image sensor of the fourth embodiment, in manufacturing sequence. These manufacturing processes are explained in (41) to (46) below.

(41) As shown in FIG. 16(a), a color resist 3R is applied (0.5 to 2 μm) on insulating film 2. As this process is the same as that in (31), detailed explanation shall be omitted.

(42) The color resist 3R is only formed above photodiodes corresponding to R (red) by exposing and developing this applied color resist 3R. As this process is the same as that in (32), detailed explanation shall be omitted.

(43) As shown in FIG. 16(b), even with regard to G (green) and B (blue), a color resist is formed above photodiodes corresponding to each color by performing application, exposure, and development of the color resist 3G and 3B in the same manner. As this process is the same as that in (33), detailed explanation shall be omitted.

(44) As shown in FIG. 16(c), an in-layer lens shape is formed on top of a color resist. As this process is the same as that in (34), detailed explanation shall be omitted.

(45) As shown in FIG. 16(d), an in-layer lens 3a is formed by transferring a shape of the formed in-layer lens to the color resist. As this process is the same as that in (35), detailed explanation shall be omitted.

(46) As shown in FIG. 16(e), a flattening film 8 is formed on the in-layer lens 3a. As this process is the same as that in (15), detailed explanation shall be omitted.

The solid-state image sensor shown in FIG. 11 can be manufactured through the manufacturing process mentioned above. Moreover, although a case of primary color filters is explained in the aforementioned processes in (41) to (43), a complementary color filter can also be formed in the same manner as previously explained in (12).

(Variation)

Figure 17:
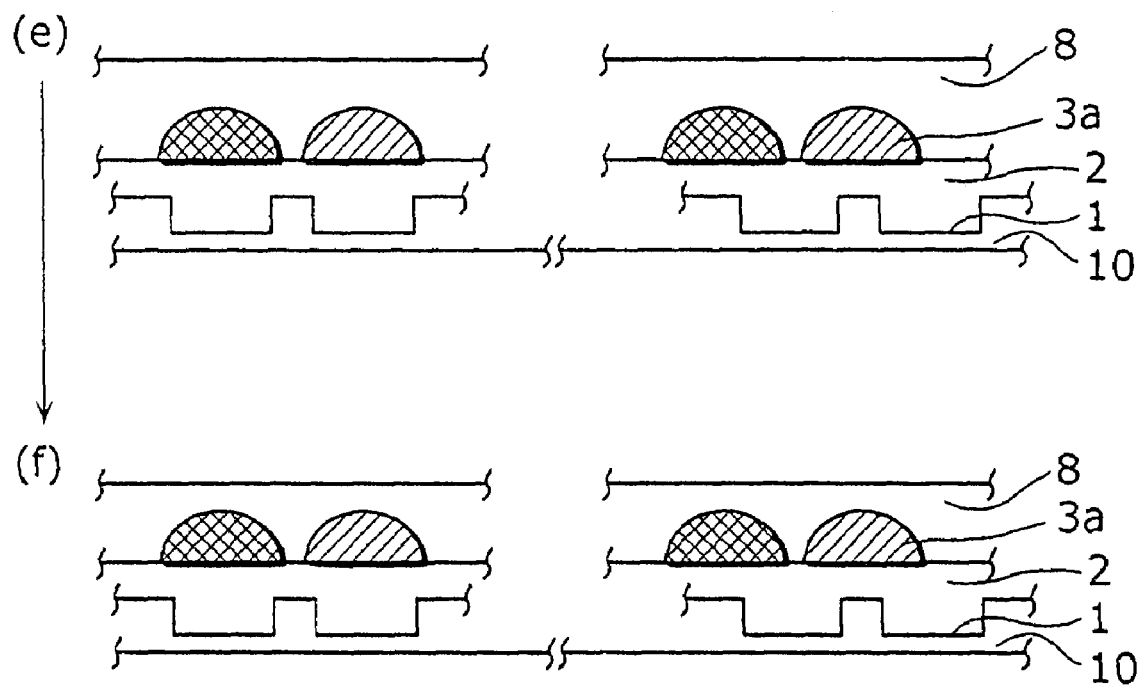
FIG. 17 is a diagram illustrating a variation of the manufacturing process for the solid-state image sensor of the fourth embodiment.

Moreover, processes in (46a) and (47) can also be performed in place of the process in (46) mentioned previously in the manufacturing method shown in FIG. 16(a) to (e). FIG. 17(e) to (f) is a diagram illustrating cross-sections for the processes in (46a) and (47) in this variation.

(46a) As shown in FIG. 17(e), a flattening film 8 is formed on an in-layer lens 3a. To be specific, a 0.5 to 2 μm transparent film of acrylic resin (refractive index n=1.4 to 1.5) is applied.

(47) As shown in FIG. 17(f), film thickness is adjusted by etching this applied transparent film. Moreover, (46a) and (47) can be repeated. With this, the film thickness of the flattening film 8 can be precisely adjusted.

In this manner, the solid-state image sensor shown in FIG. 11 can be manufactured, and the film thickness of the flattening film 8 can be accurately optimized, even through the present variation.

Furthermore, although primary color filters and complementary color filters are explained as examples of color filters, primary color filters can be used for solid-state image sensors that prioritize color tone, and a complementary color scheme can be used in a solid-state image sensor that prioritizes resolution and sensitivity.

Furthermore, color resists that contain a dye, color resists that contain a pigment, and the like, exist as material for forming the color filter 5, and any of such options is possible. Furthermore, a color filter can also be formed by dyeing a dyeable transparent resist.

Although only some exemplary embodiments of this invention have been described in detail above, those skilled in the art will readily appreciate that many modifications are possible in the exemplary embodiments without materially departing from novel teachings and advantages of this invention. Accordingly, all such modifications are intended to be included within the scope of this invention.

INDUSTRIAL APPLICABILITY

The present invention is suitable for a solid-state image sensor possessing a micro-lens on each of a plurality of light-receiving elements formed on a semiconductor substrate, a manufacturing method thereof, and a camera with such a solid-state image sensor, and is suitable, for example, for a CCD image sensor, an MOS image sensor, a digital still camera, a built-in mobile phone camera, a built-in notebook computer camera, a camera unit connected to an information processing device, and the like.

What is claimed is:

1. A solid-state image sensor comprising:
light-receiving elements arranged in a light-receiving area;
micro-lenses corresponding to said light-receiving elements; and
a transparent film on said micro-lenses for moderating incidence angle of oblique light, entering the solid-state image sensor from above the solid-state image sensor, at a periphery of said light-receiving area, wherein, in a central portion of said light-receiving area a corresponding one of said micro-lenses is directly above a corresponding one of said light-receiving elements, and in a portion of said light-receiving area that is closer to the periphery of said light-receiving area than a center of said light-receiving area corresponding ones of said micro-lenses are offset from directly above corresponding ones of said light-receiving elements towards the center of said light receiving area, such that when the oblique light enters the solid-state image sensor from above the solid-state image sensor at the periphery of said light-receiving area, the oblique light is refracted towards said light-receiving elements by said transparent film and further refracted towards said light-receiving elements by said micro-lenses.

2. The solid-state image sensor according to claim 1, wherein a refractive index of said transparent film is less than a refractive index of said micro-lenses.

3. The solid-state image sensor according to claim 2, wherein said solid-state image sensor is a CCD-type image sensor.

4. The solid-state image sensor according to claim 2, wherein said solid-state image sensor is an MOS-type image sensor.

5. The solid-state image sensor according to claim 1, wherein said solid-state image sensor is a CCD-type image sensor.

6. The solid-state image sensor according to claim 1, wherein said solid-state image sensor is an MOS-type image sensor.

7. The solid-state image sensor according to claim 1, further comprising:

color filters corresponding to said light-receiving elements;

wherein, in said central portion of said light-receiving area, a corresponding one of said color filters is directly above said corresponding one of said light-receiving elements, and in said portion of said light-receiving area that is closer to the periphery of said light-receiving area than the center of said light-receiving area, corresponding ones of said color filters are offset from directly above corresponding ones of said light-receiving elements towards the center of said light-receiving area.

8. The solid-state image sensor according to claim 7, wherein an amount of offset of each of said corresponding ones of said micro-lenses is greater than an amount of offset of a respective one of said corresponding ones of said color filters.

9. The solid-state image sensor according to claim 7, wherein each of said color filters has a convex shape.

10. The solid-state image sensor according to claim 1, wherein a distance from one of said light-receiving elements to a bottom of a corresponding one of said micro-lenses is in a range of 3 µm to 5 µm inclusive.

11. The solid-state image sensor according to claim 1, wherein a refractive index of said micro-lenses is in a range of 1.6 to 1.7 inclusive.

12. The solid-state image sensor according to claim 2, wherein a refractive index of said micro-lenses is in a range of 1.6 to 1.7 inclusive.

13. The solid-state image sensor according to claim 1, wherein a refractive index of said transparent film is in a range of 1.4 to 1.5 inclusive.

14. The solid-state image sensor according to claim 2, wherein a refractive index of said transparent film is in a range of 1.4 to 1.5 inclusive.

15. The solid-state image sensor according to claim 1, further comprising color filters each formed between corresponding ones of said light-receiving elements and said micro-lenses.

16. The solid-state image sensor according to claim 15, wherein each of said color filters has a convex shape.

17. The solid-state image sensor according to claim 15, wherein a refractive index of said transport film is less than a refractive index of said micro-lenses.

18. The solid-state image sensor according to claim 17, wherein said solid-state image sensor is a CCD-type image sensor.

19. The solid-state image sensor according to claim 17, wherein said solid-state image senosr is an MOS-type image sensor.

20. The solid-state image sensor according to claim 17, wherein a refractive index of said micro-lenses is in a range of 1.6 to 1.7 inclusive.

21. The solid-state image sensor according to claim 17, wherein a refractive index of said transparent film is in a range of 1.4 to 1.5 inclusive.

22. The solid-state image sensor according to claim 15, whereon said solid-state image sensor is a CCD-type image sensor.

23. The solid-state image sensor according to claim 15, wherein said solid-state image sensor is an MOS-type image sensor.

24. The solid-state image sensor according to claim 15, wherein each of said color filters has a convex shape.

25. The solid-state image sensor according to claim 15, wherein a distance from one of said light-receiving elements to a bottom of a corresponding one of said micro-lenses is in a range of 3µm to 5µm inclusive.

26. The solid-state image sensor according to claim 15, wherein a refractive index of said micro-lenses is in a range of 1.6 to 1.7 inclusive.

27. The solid-state image sensor according to claim 15, wherein a refractive index of said transparent film is in a range of 1.4 to 1.5 inclusive.

28. The solid-state image sensor according to claim 15, wherein said transparent film is formed so as to fill in a space between adjacent micro lenses.

29. The solid-state image sensor according to claim 15, wherein said micro-lenses constitute color filters.

30. The solid-state image sensor according to claim 1, wherein said transparent film is formed so as to fill in a space between adjacent micro lenses.

31. The solid-state image sensor according to claim 1, wherein said micro-lenses constitute color filters.

* * * * *